United States Patent
Zhang et al.

(10) Patent No.: US 9,034,662 B2
(45) Date of Patent: May 19, 2015

(54) MR ENHANCING LAYER (MREL) FOR SPINTRONIC DEVICES

(71) Applicant: Headway Technologies, Inc., Milpitas, CA (US)

(72) Inventors: Kunliang Zhang, Fremont, CA (US); Min Li, Fremont, CA (US); Yuchen Zhou, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/244,923

(22) Filed: Apr. 4, 2014

(65) Prior Publication Data

US 2014/0220708 A1    Aug. 7, 2014

Related U.S. Application Data

(62) Division of application No. 12/799,468, filed on Apr. 26, 2010, now Pat. No. 8,692,343.

(51) Int. Cl.
| | |
|---|---|
| *H01L 43/12* | (2006.01) |
| *G11B 5/39* | (2006.01) |
| *B82Y 25/00* | (2011.01) |
| *B82Y 40/00* | (2011.01) |

(Continued)

(52) U.S. Cl.
CPC .............. *H01L 43/12* (2013.01); *G11B 5/3967* (2013.01); *B82Y 25/00* (2013.01); *B82Y 40/00* (2013.01); *G11B 5/3929* (2013.01); *H01F 10/193* (2013.01); *H01F 10/1936* (2013.01); *H01F 10/3272* (2013.01); *H01F 10/3295* (2013.01); *H01F 41/303* (2013.01); *H01L 29/66984* (2013.01); *H01L 43/10* (2013.01); *H01L 29/82* (2013.01); *H01L 43/08* (2013.01); *H01L 43/02* (2013.01); *H01F 1/401* (2013.01)

(58) Field of Classification Search
CPC .... G11B 5/3929; G11B 5/3967; H01L 43/02; H01L 43/08; H01L 43/10; H01L 43/12; H01L 29/66984; H01F 10/3295; H01F 41/303; B82Y 25/00; B82Y 40/00
USPC ............ 257/43, 421, 425, E43.001, E29.323; 438/3

See application file for complete search history.

(56) References Cited

U.S. PATENT DOCUMENTS

| | | |
|---|---|---|
| 5,627,704 A | 5/1997 | Lederman et al. |
| 5,668,688 A | 9/1997 | Dykes et al. |

(Continued)

OTHER PUBLICATIONS

"Spin-dependent CPP transport properties of ZnO/ferromagnetic heterostructures," by Yanxue Chen et al., Physics Letters A 303, (Oct. 7, 2002) 91-96, NH Elsevier.

(Continued)

*Primary Examiner* — Allan R Wilson
(74) *Attorney, Agent, or Firm* — Saile Ackerman LLC; B. Ackerman Stephen

(57) ABSTRACT

The performance of an MR device has been improved by inserting one or more Magneto-Resistance Enhancing Layers (MRELs) into approximately the center of one or more of the magnetic layers such as an inner pinned (AP1) layer, spin injection layer (SIL), field generation layer (FGL), and a free layer. An MREL is a layer of a low band gap, high electron mobility semiconductor such as ZnO or a semimetal such as Bi. The MREL may further comprise a first conductive layer that contacts a bottom surface of the semiconductor or semimetal layer, and a second conductive layer that contacts a top surface of the semiconductor or semimetal layer.

16 Claims, 3 Drawing Sheets

(51) Int. Cl.
*H01F 41/30* (2006.01)
*H01L 29/66* (2006.01)
*H01L 43/10* (2006.01)
*H01L 43/08* (2006.01)
*H01L 43/02* (2006.01)
*H01F 1/40* (2006.01)
*H01F 10/193* (2006.01)
*H01F 10/32* (2006.01)
*H01L 29/82* (2006.01)

(56) References Cited

U.S. PATENT DOCUMENTS

| | | | |
|---|---|---|---|
| 5,715,121 A | 2/1998 | Sakakima et al. | |
| 6,876,523 B2 | 4/2005 | Takahashi et al. | |
| 6,917,088 B2 | 7/2005 | Takahashi et al. | |
| 7,116,529 B2 | 10/2006 | Yoshikawa et al. | |
| 7,223,485 B2 | 5/2007 | Yuasa et al. | |
| 7,381,480 B2 | 6/2008 | Nakamura et al. | |
| 7,479,394 B2 * | 1/2009 | Horng et al. | 438/3 |
| 7,525,772 B2 | 4/2009 | Koui et al. | |
| 7,596,015 B2 | 9/2009 | Kitagawa et al. | |
| 8,609,262 B2 * | 12/2013 | Horng et al. | 428/811.1 |
| 2002/0048128 A1 | 4/2002 | Kamiguchi et al. | |
| 2007/0014054 A1 | 1/2007 | Zhang et al. | |
| 2007/0070556 A1 | 3/2007 | Zhang et al. | |
| 2007/0297103 A1 * | 12/2007 | Zhang et al. | 360/324.12 |
| 2008/0180991 A1 * | 7/2008 | Wang | 365/171 |
| 2008/0278864 A1 | 11/2008 | Zhang et al. | |
| 2009/0108383 A1 * | 4/2009 | Horng et al. | 257/421 |
| 2011/0014500 A1 * | 1/2011 | Horng et al. | 428/846.3 |
| 2014/0099735 A1 * | 4/2014 | Horng et al. | 438/3 |

OTHER PUBLICATIONS

"MgO-Based Tunnel Junction Material for High-Speed Toggle Magnetic Random Access Memory," by Renu W. Dave et al., IEEE Transactions on Magnetics, vol. 42, No. 8, Aug. 2006, pp. 1935-1939.

"The scalability of CPP-GMR heads toward over 100Gbpsi, compared with TMR heads," by M. Takagishi et al., Toshiba TMRC 2001, Aug. 20, 2001, 10 pgs.

Japanese Office Action 2011-098800 Mailed: Aug. 19, 2014, Headway Technologies Inc.

* cited by examiner

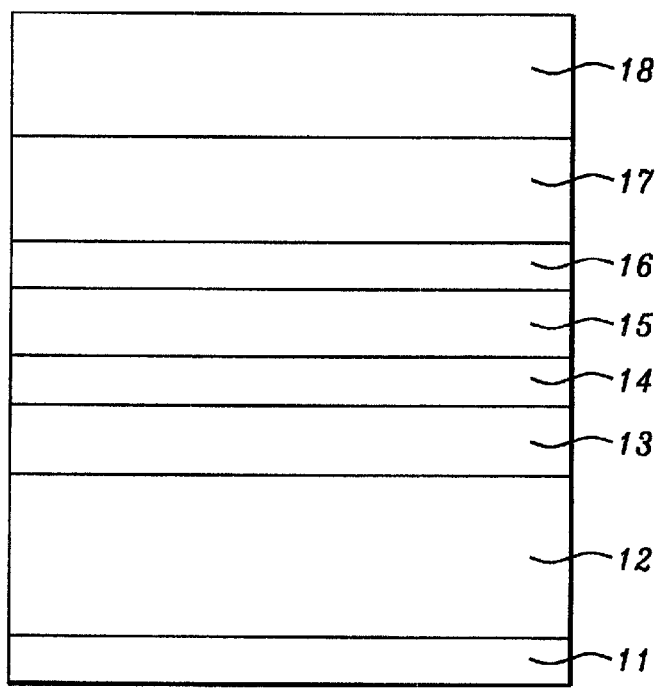
*FIG. 1 - Prior Art*
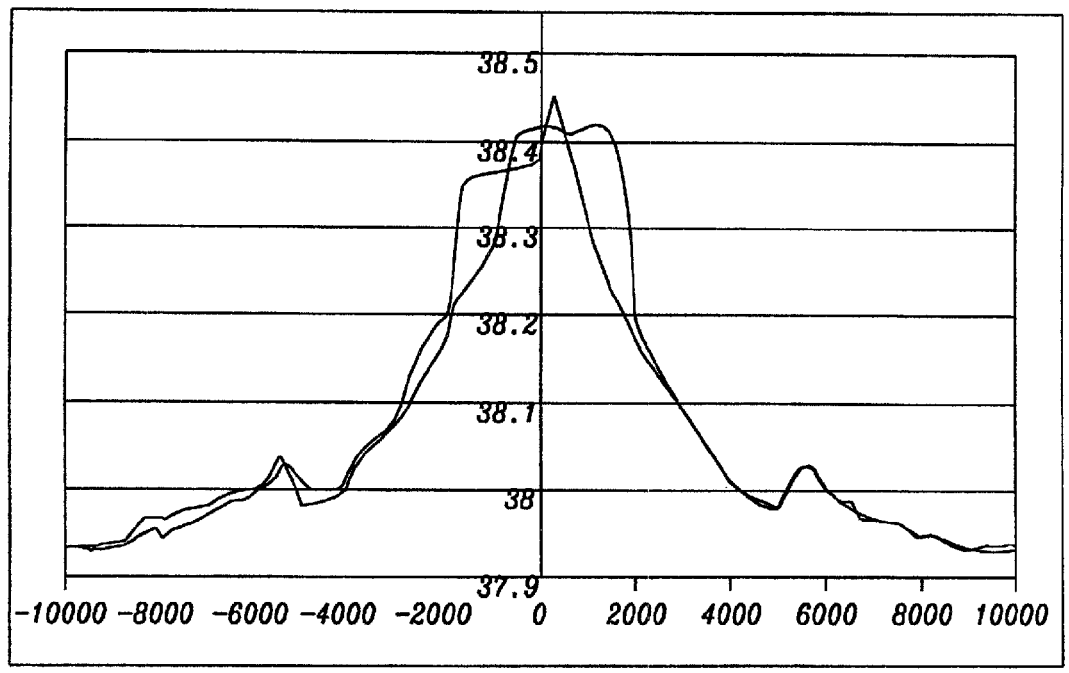
*FIG. 2 - Prior Art*

MR ENHANCING LAYER (MREL) FOR SPINTRONIC DEVICES

This is a Divisional application of U.S. patent application Ser. No. 12/799,468, filed on Apr. 26, 2010, which is herein incorporated by reference in its entirety, and assigned to a common assignee.

FIELD OF THE INVENTION

The invention relates to the general field of magneto-resistance (MR) devices with particular reference to improving their performance.

BACKGROUND OF THE INVENTION

A typical example of a spintronic device is a magneto-resistance sensor. As shown schematically in FIG. 1, this includes seed layer 11, an antiferromagnetic (AFM) pinning layer 12, outer pinned layer 13 (anti-parallel 2 or AP2), AFM coupling layer 14, typically, but not limited to, Ru, inner pinned layer 15 (AP1), spacer layer 16, free layer (FL) 17, and capping layer 18. Depending on whether spacer layer 16 is conductive or insulating (i.e. a barrier layer), the sensor is either a Giant Magneto-Resistance (GMR) device or a Tunneling Magneto-Resistance (TMR) device.

As recording densities increase, device sizes become correspondingly smaller. Consequently the sensor (or other spintronic device) has to continue having a high enough magneto-resistance (MR) ratio, as well as a low enough resistance x area product (RA), for it to still have sufficient output amplitude and also for it to be suitable for future extendibility. It is, however, becoming increasingly more difficult for MgO-based TMR devices to maintain their current high MR ratio in the lower RA region. Current Perpendicular to the Plane (CPP) GMR or Confined Current Path (CCP) GMR devices have not yet been able to produce high enough MR ratios for them to take over as the future read head technologies. There is thus an urgent need for sensors that have higher output amplitude and/or a higher MR ratio.

The present invention, as will be detailed below, discloses some novel methods for further enhancing the MR ratio.

A routine search of the prior art was performed with the following references of interest being found:

U.S. Pat. No. 7,596,015 (Kitigawa et al) shows a free layer including an intermediate layer of Cu and/or Zn or Sn. (See col. 5, lines 58-63 free layer is the same as recording layer 12, and see col. 11, lines 1-15 for materials added to the recording layer—at least one of the materials including Cu, Zn, and Sn).

U.S. Pat. No. 7,223,485 (Yuasa et al) teaches an insertion layer in the free layer. (See col. 2-3 where the insert layer contains at least one element from Cu, Zn, O). K. Zhang et al, HT06-055 "A novel CPP device with enhanced MR ratio" and the reference therein. Y. Chen et al, "Spin-dependent CPP transport properties of ZnO/ferromagnet Heterostructures" Physics Letters A 303 (2002) 91-96.

SUMMARY OF THE INVENTION

It has been an object of at least one embodiment of the present invention to provide a method for enhancing the performance, particularly the MR and R.A ratios, of magneto-resistance devices.

Another object of at least one embodiment of the present invention has been to provide a process for manufacturing the invention.

A further object of at least one embodiment of the present invention has been that said process be fully compatible with existing processes for manufacturing spintronic devices.

Still another object of at least one embodiment of the present invention has been to provide a detailed description thereof.

These objects have been achieved by inserting one or more Magneto-Resistance Enhancing Layers (MRELs) into approximately the center of one or more of the active layers (such as the magnetic AP1, spin induction layer or SIL, and free layers). An MREL is a layer of a low band gap, high electron mobility semiconductor such as ZnO or a semimetal such as Bi. Optionally, the interface(s) between the MREL and the magnetic layer into which it has been inserted may be bridged by a thin layer of a highly conductive metal such as copper so as to ensure an ohmic contact across the full interface between the MREL and the magnetic layer.

BRIEF DESCRIPTION OF THE DRAWINGS

FIG. 1 is a cross-sectional view of a typical MR device of the prior art.

FIG. 2 is a perpendicular RH curve for a Ta10/Ru20/Cu20/[Co2/Ni6]x15/Cu20/FeCo150/Ru10/Ta40/Ru30 structure of the prior art.

DESCRIPTION OF THE PREFERRED EMBODIMENTS

We have found that when a trilayer of a low band gap semiconductor such as ZnO, sandwiched between layers of a conductive metal such as Cu (to form Cu3/ZnO15/Cu3 for example), is inserted into a spintronic device the MR ratio of that device is increased significantly. An early example of this was discovered in the course of experiments with a spin torque oscillator (STO), patterned to around 45×45 nm, whose structure was the following: Ta10/Ru20/Cu20/[Co2/Ni6]x15/Cu20/FeCo150/Ru10/Ta40/Ru30. This device had almost no MR ratio for the in-plane RH measurement. However, when the applied field was close to the perpendicular direction (specifically, H was tilted 7 degrees from the perpendicular direction), the observed MR ratio was typically about 1.5% with an RA of about 0.06. A typical RH curve is shown in FIG. 2.

Figure 3:
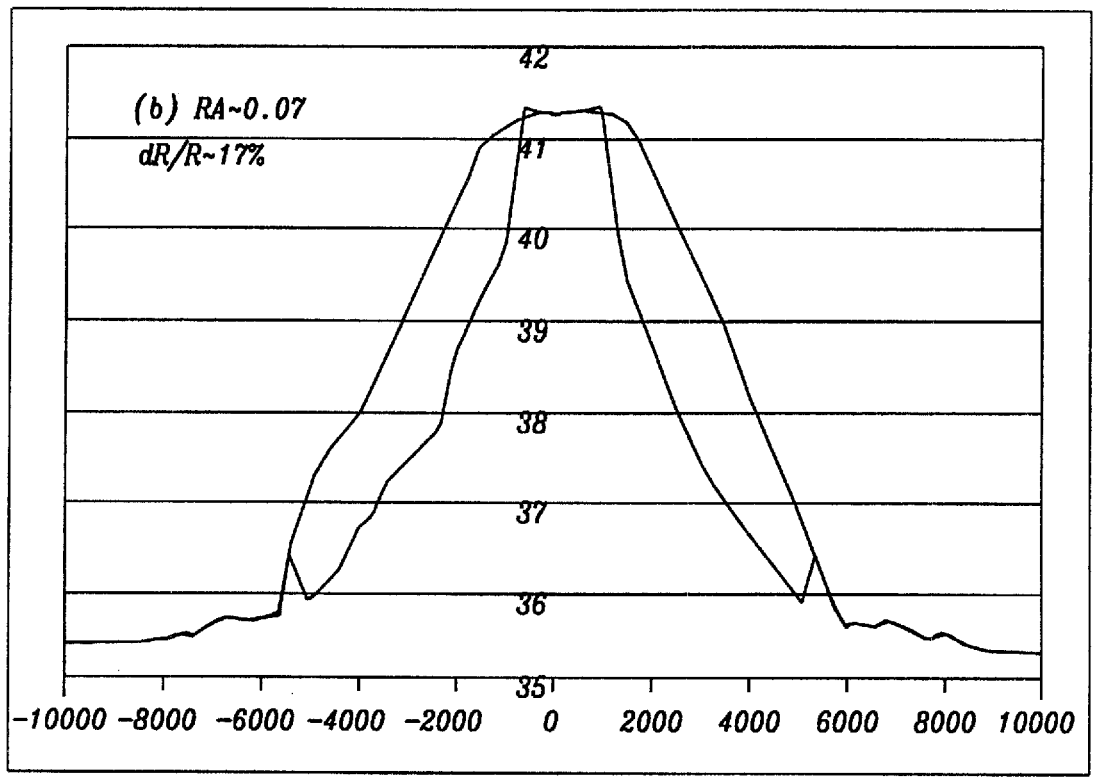
FIG. 3 is a perpendicular RH curve for the structure shown in FIG. 2 modified to become Ta10/ . . . x15/Cu20/FeCo75/Cu3/ZnO15/Cu3/FeCo75/ . . . /Ta40/Ru30.

After insertion of the above-specified trilayer (MREL) into the ferromagnetic (FM) FeCo layer, the resulting full structure became Ta10/Ru20/Cu20/[Co2/Ni6]x15/Cu20/FeCo75/Cu3/ZnO15/Cu3/FeCo75/Ru10/Ta40/Ru30). The MR ratio of the MREL modified structure was found to have increased significantly (from about 1.3% to as high as 17%) with little change in the RA product. A typical curve is shown in FIG. 3. This measurement was performed at an angle of 7 degrees off vertical so it is likely that if the applied field used for the measurement is made to be precisely normal to the plane of the film, a much higher MR value will be obtained.

Figure 4:
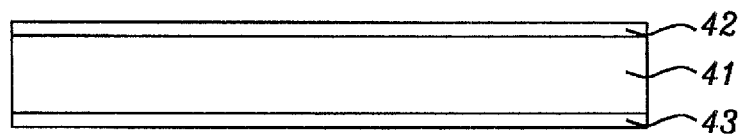
FIG. 4 is a cross-sectional view of a typical MREL.

In FIG. 4 we show a schematic cross-section of a MREL in which a central semiconductor (or semimetal) layer 41 is seen sandwiched between two (optional) metal layers 42 and 43.

Some additional findings about the MREL structure were the following. First, the thickness chosen for the Cu3/ZnO15/Cu3 trilayer must ensure that the two 75 Angstrom thick FeCo layers on either side of it are strongly exchange coupled with each other. The fulfillment of this condition was confirmed when a MH loop measured on a Ta20/Ru20/IrMn70/FeCo75/Cu3/ZnO15/Cu3/FeCo75 film stack showed only one hysteresis loop for the two FeCo layers, indicating that said layers are strongly coupled together.

Second, an in-plane measurement showed almost no MR ratio, which is very similar to what was observed for the reference case. These facts indicate that the high MR ratio cannot be coming from the magnetic switching of the [FeCo75/Cu3/ZnO15/Cu3/FeCo75] stack of layers, but rather from the [Co2/Ni6]x15/Cu20/[FeCo75/Cu3/ZnO15/Cu3/FeCo75] switching across the Cu spacer. Thus, the [FeCo75/Cu3/ZnO15/Cu3/FeCo75] stack behaves as though it is a single layer (like the original FeCo150 layer that it replaced).

These findings confirm that the Cu3/ZnO15/Cu3 trilayer acts as an MR enhancing layer. It is thought that the spin scattering coefficient of the [FeCo75/Cu3/ZnO/Cu3/FeCo75] stack is significantly enhanced by the insertion of the Cu3/ZnO15/Cu3 trilayer. This is in accordance with the Schmitt theory, which shows that when spin is injected from a FM metal (FeCo) into a semiconductor (e.g. ZnO), the spin coefficient is proportional to the ratio of the conductivity of the semiconductor to that of the FM metal.

It is also possible that the Cu3/ZnO/Cu3 MREL acts as a spin filtering layer, possibly even one operating under a ballistic scattering regime. Regardless of the precise mechanism at work here, the MR enhancement that results from inserting the Cu/ZnO/Cu (or similar layer) can be realized in a wide variety of applications that we will detail below.

Before describing several applications for these MRELs we note the following. In the general case, the MREL's structure is M1/low band gap, high mobility, N-type semi-conductor/M2, where (a) M1 and M2 are high conductivity metals such as (but not limited to) Cu, Ag, Au, C (including Graphene, nanotubes etc), Zn, Ti, Sn, Cr, Al, Mg, and Ru. M1 and M2 will generally be the same material and will have the same thickness (ranging from 0 to 50 Å), with about 3 Å Cu for both M1 and M2 being preferred. However, M1 and M2 may be different materials and they may have different thicknesses without significantly affecting the effectiveness of the invention.

(b) Additionally, the basic M1/semiconductor/M2 trilayer structure that makes up the MREL may be repeated in situ one or more times, each such additional trilayer not necessarily comprising the same materials and/or individual thicknesses as other trilayers in the same MREL.

(c) The band gap of the semiconductor portion of the MREL should be in a range of from 0.3 to 8 eV, with from 1 to 6 eV being preferred.

(d) The electron mobility of the semiconductor portion of the MREL should be in a range of from 10 to 2,000,000_$cm^2 \cdot sec^{-1} \cdot V^{-1}$ with from 50 to 50,000 $cm^2 \cdot sec^{-1} \cdot V^{-1}$ being preferred.

Examples of suitable semi-conductor materials include (but are not limited to) ZnO, ZnS, $Zn_xMg_{(1-x)}O$ (x ranging from 0 to 0.99), ZnCuO, ZnCdO, ZnAlO, ZnSe, ZnTe, Si, Ge, $TiO_2$, AlN, GaN, InN, AlP, AlAs, AlSb, GaP, GaAs, GaSb, InP, InAs, ZnS, CdS, CdTe, HgTe, PbS, PbSe, PbTe, SnO, SnTe, $Cu_2O$, $FeSi_2$, CrMnSi, $Mg_2Si$, $RuSi_3$, and $Ir_3Si_5$.

The semiconductor portion may be undoped or its conductivity may be adjusted by the inclusion of a dopant selected from the group consisting of Si, B, Mg, Mn, Al, Cu, Cd, Cr, Zn, Ti, Sn, Zr, Hf, Ru, Mo, Nb, Co, Fe, and Ni. Moreover, the semiconductor portion may be replaced by a semi-metal such as Sb, Bi, CoSi, $Co_xFe_{(1-x)}Si$, $Co_xNi_{(1-x)}Si$, $Co_xMn_{(1-x)}Si$, FeSi, or $Co_xCr_{(1-x)}Si$. The semiconductor/semimetal layer should have a thickness in a range of from 1 to 50 Å, with from 3 to 20 Å being preferred.

We now describe several examples of how these MR enhancing layers may be used to improve the performance of existing MR devices. These include (but are not limited to) GMR devices (including CIP, CPP, and CPP/CCP versions), TMR devices, spin injection devices, magnetic random access memories (MRAMs) and microwave assisted magnetic recording (MAMR) devices (see item 4 below).

It will be understood that those skilled in the art may be able to identify additional spintronic devices not listed above (such as, for example, sensors of all types (including biosensors), thermally assisted magneto-resistance (TAMR) devices, or dual spin valve devices to which the principles disclosed by the present invention would obviously be applicable.

1. GMR Devices:

A prior art structure is seed/AFM/AP2/Ru/AP1/conductive spacer/FL/cap. Possible structures based on the invention (see FIG. 4) are the following:
seed/AFM/AP2/Ru/[FM1/MREL/FM2]/conductive spacer/FL/cap [enhanced AP1];
seed/AFM/AP2/Ru/AP1/conductive spacer/[FL1/MREL/FL2]/cap [enhanced free layer];
and seed/AFM/AP2/Ru/[FM1/MREL/FM2]/conductive spacer/[FL1/MREL/FL2]/cap
wherein both of the AP1 layer and free layer comprise a MREL.

The spacer layer could be a uniform metallic layer (CPP devices) or it could be in the form of conductive islands embedded in an insulating matrix such as, for example, Cu in $Al_2O_3$ (CPP/CCP devices).

2. TMR Devices:

A prior art structure is seed/AFM/AP2/Ru/AP1/barrier layer/FL/cap. Possible structures based on the invention (see FIG. 4) are the following:
seed/AFM/AP2/Ru/[FM1/MREL/FM2]/barrier layer/FL/cap [enhanced AP1];
seed/AFM/AP2/Ru/AP1/barrier layer/[FL1/MREL/FL2]/cap [enhanced free layer];
and seed/AFM/AP2/Ru/[FM1/MREL/FM2]/barrier layer/[FL1/MREL/FL2]/cap.

The barrier layer could be MgO, AlO, TiO, ZnO, Zn/ZnO, or Zn/ZnO/Zn (as a laminate or as ZnO with a stoichiometric excess of Zn).

Figure 5:
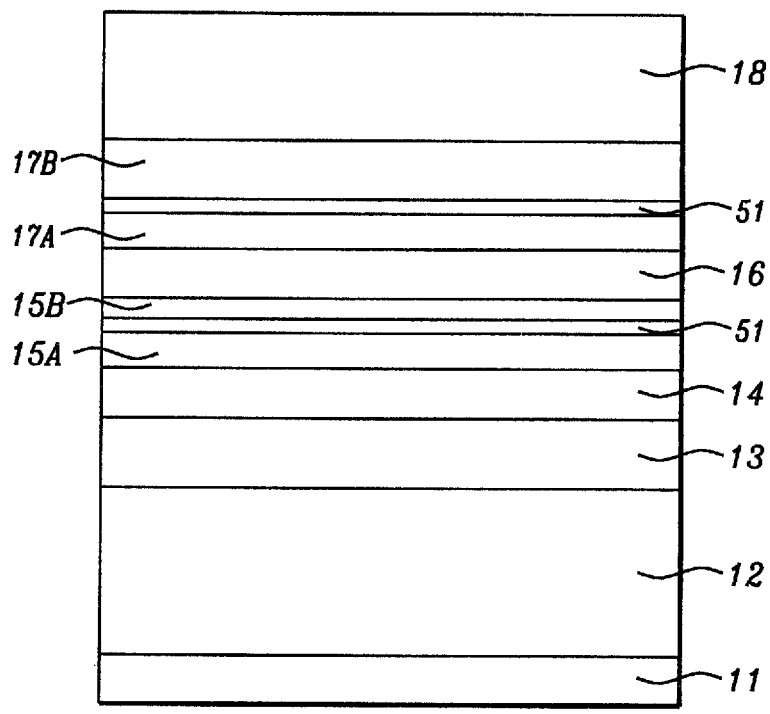
FIG. 5 illustrates a typical MR device after insertion of MRELs in both the AP1 and free layers.

FIG. 5 is a schematic view of a GMR/TMR device after insertion of MRELs into both the AP1 layer (split into sub-layers 15A and 15B) and the free layer (split into sub-layers 17A and 17B).

3. Spin Injection Layer (SIL) Devices that Operate without an AFM/AP2/Ru/AP1 Pinning Stack:

A prior art structure is seed/FM/spacer/FL/cap (including an H field normal to the layers). In other words, a field (H) is applied in a direction normal (perpendicular) to the layers after the SIL stack of layers is completed in order to magnetize the FM layer in a direction perpendicular to the top and bottom surfaces of the FM layer. Possible structures based on the invention (see FIG. 5) are the following:
seed/[FM1/MREL/FM2]/spacer/FL/cap;
seed/FM/spacer/[FL1/MREL/FL2]/cap];
and seed/FM/[FM1/MREL/FM2]/spacer/[FL1/MREL/FL2]/cap.

4. Spin Torque Oscillator (STO) Devices (Particularly the FGL or Field Generating Layer):

A prior art structure is seed/SIL/spacer/FGL/cap (including an H field normal to the layers). Possible structures based on the invention (see FIG. 5) are the following:
seed/[FM1/MREL/FM2]/spacer/FGL/cap;
seed/SIL/spacer/[FL1/MREL/FL2]/cap];
and seed/[FM1/MREL/FM2]/spacer/[FL1/MREL/FL2]/cap
wherein a first MREL is inserted in the SIL and a second MREL is inserted in the FGL.

Figure 6:
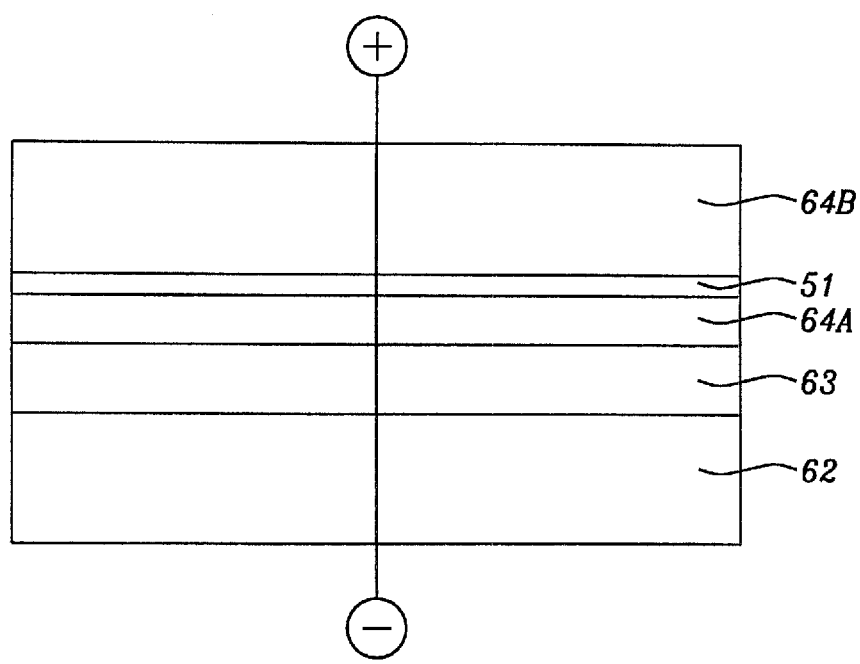
FIG. 6 shows the three main component sections of a spin torque oscillator (STO), including the field generation layer (FGL) into which has been inserted an MREL.

FIG. 6 shows the three main component sections of a spin torque oscillator (STO), including SIL 62, inter-layer 63, and the FGL comprising the sub-layers 64A and 64B which are separated from one another by MREL 51.

For the examples listed in the above four categories, the seed layer could be Ta/Ru, Ta/Cu, Ta/NiFe, Ta/NiCr, Ta/NiFeCr, Ta/Ti, Ta/Ti/Cu, Ta/Ti/Ru/Cu, etc, the AFM layer (when present) could be IrMn, PtMn, PtPdMn etc, and AP2 (where present) could be CoFe, CoFe/FeTa/CoFe, or CoFe/CoFeB/CoFe, for example.

What is claimed is:

1. A process to manufacture a magnetic read head, comprising:
    providing a seed layer and depositing thereon an antiferromagnetic (AFM) layer;
    depositing an AP2 pinned layer on said AFM layer;
    depositing an AFM coupling layer on said AP2 pinned layer;
    forming a ferromagnetic AP1 layer on said AFM coupling layer;
    depositing a spacer layer;
    forming a free layer on said spacer layer; and
    depositing a capping layer on the free layer wherein at least one of the ferromagnetic AP1 layer and the free layer further comprise a magneto-resistance enhancing layer (MREL) comprising an n-type semiconductor (S) layer selected from a group consisting of semiconductors and semimetals, and two conductive layers M1, M2 to give a FM1/M1/S/M2/FM2/spacer/free layer, AP1/spacer/FL1/M1/S/M2/FL2, or FM1/M1/S/M2/FM2/spacer/FL1/M1/S/M2/FL2 configuration where FM1 and FM2 are first and second portions of the AP1 layer that contact bottom and top surfaces, respectively, of a first MREL, and FL1 and FL2 are first and second portions of the free layer that contact bottom and top surfaces, respectively, of a second MREL, and wherein M1 and M2 are selected from a group consisting of Cu, Ag, Au, C (including graphene and nano-tubes), Zn, Ti, Sn, Cr, Al, Mg, and Ru.

2. The process of claim 1 wherein the spacer layer is electrically conductive whereby the magnetic read head is a Giant Magneto-Resistance (GMR) device.

3. The process of claim 1 wherein the spacer layer is electrically insulating whereby the magnetic read head is a Tunneling Magneto-Resistance (TMR) device.

4. The process of claim 1 wherein the semiconductors have band gaps in a range of about 1 to 6 eV and electron mobilities in a range of about 50 to 50,000 $cm^2 \cdot sec^{-1} \cdot V^{-1}$.

5. The process of claim 1 wherein the semiconductors are selected from a group consisting of ZnO, ZnS, $Zn_xMg_{(1-x)}O$, ZnCuO, ZnCdO, ZnAlO, ZnSe, ZnTe, Si, Ge, $TiO_2$, AlN, GaN, InN, AlP, AlAs, AlSb, GaP, GaAs, GaSb, InP, InAs, ZnS, CdS, CdTe, HgTe, PbS, PbSe, PbTe, SnO, SnTe, $Cu_2O$, $FeSi_2$, CrMnSi, $Mg_2Si$, $RuSi_3$, and $Ir_3Si_5$.

6. The process of claim 5 wherein said semiconductors are undoped or their conductivity is adjusted by inclusion of a dopant selected from a group consisting of Si, B, Mg, Mn, Al, Cu, Cd, Cr, Zn, Ti, Sn, Zr, Hf, Ru, Mo, Nb, Co, Fe, and Ni.

7. The process of claim 1 wherein the semimetals are selected from a group consisting of Sb, Bi, CoSi, $Co_xFe_{(1-x)}Si$, $Co_xNi_{(1-x)}Si$, $Co_xMn_{(1-x)}Si$, FeSi, and $Co_xCr_{(1-x)}Si$.

8. The process of claim 1 wherein the n-type semiconductor layer has a thickness from about 1 to 50 Angstroms.

9. The process of claim 1 wherein the n-type semiconductor layer has a band gap from about 0.3 to 8 eV.

10. A process to manufacture a spintronic device, comprising:
    providing a seed layer and forming thereon a ferromagnetic (FM) layer;
    depositing a spacer layer on the ferromagnetic layer;
    forming a free layer on said spacer layer;
    depositing a capping layer on the free layer wherein a least one of the ferromagnetic layer and the free layer further comprise a magneto-resistance enhancing layer (MREL) comprising an n-type semiconductor (S) layer selected from a group consisting of semiconductors and semimetals, and two conductive layers M1, M2 to give a FM1/M1/S/M2/FM2/spacer/free layer, AP1/spacer/FL1/M1/S/M2/FL2, or FM1/M1/S/M2/FM2/spacer/FL1/M1/S/M2/FL2 configuration where FM1 and FM2 are first and second portions of the FM layer that contact bottom and top surfaces, respectively, of a first MREL, and FL1 and FL2 are first and second portions of the free layer that contact bottom and top surfaces, respectively, of a second MREL, and wherein M1 and M2 are selected from a group consisting of Cu, Ag, Au, C (including graphene and nano-tubes), Zn, Ti, Sn, Cr, Al, Mg, and Ru; and
    applying a magnetic field normal to the plane of the FM layer to magnetize the FM layer in a direction that is normal to a bottom surface and top surface of the FM layer.

11. The process of claim 10 wherein the semiconductors have band gaps in a range of about 1 to 6 eV and electron mobilities in a range of about 50 to 50,000 $cm^2 \cdot sec^{-1} \cdot V^{-1}$.

12. The process of claim 10 wherein the semiconductors are selected from a group consisting of ZnO, ZnS, $Zn_xMg_{(1-x)}O$, ZnCuO, ZnCdO, ZnAlO, ZnSe, ZnTe, Si, Ge, $TiO_2$, AlN, GaN, InN, AlP, AlAs, AlSb, GaP, GaAs, GaSb, InP, InAs, ZnS, CdS, CdTe, HgTe, PbS, PbSe, PbTe, SnO, SnTe, $Cu_2O$, $FeSi_2$, CrMnSi, $Mg_2Si$, $RuSi_3$, and $Ir_3Si_5$.

13. The process of claim 12 wherein the semiconductors are undoped or their conductivity is adjusted by inclusion of a dopant selected from a group consisting of Si, B, Mg, Mn, Al, Cu, Cd, Cr, Ti, Zr, Hf, Ru, Mo, Nb, Co, Fe, and Ni.

14. The process of claim 10 wherein said semimetals are selected from the group consisting of Sb, Bi, CoSi, $Co_xFe_{(1-x)}Si$, $Co_xNi_{(1-x)}Si$, $Co_xMn_{(1-x)}Si$, FeSi, and $Co_xCr_{(1-x)}Si$.

15. The process of claim 10 wherein the n-type semiconductor layer has a thickness from about 1 to 50 Angstroms.

16. The process of claim 10 wherein the n-type semiconductor layer has a band gap from about 0.3 to 8 eV.

* * * * *